US009983414B2

(12) United States Patent
McColloch et al.

(10) Patent No.: US 9,983,414 B2
(45) Date of Patent: May 29, 2018

(54) OPTOELECTRONIC MODULE HAVING A STAMPED METAL OPTIC

(71) Applicant: NanoPrecision Products, Inc., El Segundo, CA (US)

(72) Inventors: Laurence R. McColloch, Santa Clara, CA (US); Michael K. Barnoski, Pacific Palisades, CA (US); Robert R. Vallance, Newbury Park, CA (US); Shuhe Li, Pasadena, CA (US)

(73) Assignee: NANOPRECISION PRODUCTS, INC., El Segundo, CA (US)

( * ) Notice: Subject to any disclaimer, the term of this patent is extended or adjusted under 35 U.S.C. 154(b) by 370 days.

(21) Appl. No.: 13/658,379

(22) Filed: Oct. 23, 2012

(65) Prior Publication Data
US 2014/0112668 A1 Apr. 24, 2014

(51) Int. Cl.
| H01L 33/60 | (2010.01) |
| F21V 7/00 | (2006.01) |
| G02B 27/62 | (2006.01) |
| H01S 5/022 | (2006.01) |

(52) U.S. Cl.
CPC .......... *G02B 27/62* (2013.01); *H01S 5/02252* (2013.01); *H01S 5/02288* (2013.01); *H01S 5/02292* (2013.01); *Y10T 29/49826* (2015.01)

(58) Field of Classification Search
CPC ..... H01L 33/60; G02B 5/0808; F21V 7/0066; F21Y 2101/02; F21Y 2101/025
See application file for complete search history.

(56) References Cited

U.S. PATENT DOCUMENTS

| 4,767,340 | A | | 8/1988 | Hohorst |
| 4,992,704 | A | * | 2/1991 | Stinson ........................ 315/312 |
| 5,606,181 | A | * | 2/1997 | Sakuma et al. ................. 257/88 |
| 6,603,148 | B1 | * | 8/2003 | Sano et al. ...................... 257/98 |
| 6,712,527 | B1 | | 3/2004 | Chan et al. |
| 7,317,181 | B2 | * | 1/2008 | Murakami et al. ......... 250/214.1 |
| 7,335,522 | B2 | * | 2/2008 | Wang et al. .................... 438/26 |
| 7,499,288 | B2 | * | 3/2009 | Tanaka et al. ................ 361/767 |

(Continued)

FOREIGN PATENT DOCUMENTS

| DE | 19810310 C1 | 7/1999 |
| DE | 19512371 C2 | 7/2002 |

(Continued)

OTHER PUBLICATIONS

M.F. Dautartas; A.M. Benzoni; S.L. Broutin; A. Coucoulas; D.T. Moser Y.H. Wong; Yiu-Man Wong; Optical Performance of Low-cost Self-aligned MCM-D Based Optical Data Links; IEEE Transactions on Components, Packaging, and Manufacturing Technology; Aug. 1996; 554-561; vol. 19 No. 3; IEEE, United States.

(Continued)

*Primary Examiner* — Ismael Negron
(74) *Attorney, Agent, or Firm* — Liu & Liu

(57) ABSTRACT

A stamped metal optic includes at least a bench for holding at least one optoelectronic component and a reflector for folding an optical pathway. The stamped metal optic is formed of a piece of metal that is shaped using known metal stamping techniques. The stamped metal optic preferably has at least one fiducial mark used to ensure that the optoelectronic device is precisely aligned with the reflector.

11 Claims, 6 Drawing Sheets

(56) References Cited

U.S. PATENT DOCUMENTS

| | | | |
|---|---|---|---|
| 7,520,682 B2 | 4/2009 | Eom et al. | |
| 7,528,414 B2* | 5/2009 | Huang et al. | 257/79 |
| 7,771,093 B2* | 8/2010 | Kishikawa et al. | 362/363 |
| 8,067,884 B2* | 11/2011 | Li | 313/501 |
| 8,101,955 B2* | 1/2012 | Keh et al. | 257/81 |
| 8,174,100 B2* | 5/2012 | Yong et al. | 257/676 |
| 8,188,498 B2* | 5/2012 | Kim et al. | 257/98 |
| 8,710,525 B2* | 4/2014 | Takahashi et al. | 257/98 |
| 2007/0003195 A1 | 1/2007 | Ice et al. | |
| 2008/0247712 A1 | 10/2008 | Hogen et al. | |

FOREIGN PATENT DOCUMENTS

| | | |
|---|---|---|
| DE | 19614977 B4 | 11/2010 |
| EP | 0867973 A1 | 9/1998 |
| JP | 58052612 A | 3/1983 |

OTHER PUBLICATIONS

Kostin, Vladimir, "Firm Wago: Cage Clamp Technology for the Third Millenium," 1997, pp. 89-93, WAGO Kontakttechnik GmbH.

\* cited by examiner

OPTOELECTRONIC MODULE HAVING A STAMPED METAL OPTIC

TECHNICAL FIELD OF THE INVENTION

The invention relates to optical communications modules. More particularly, the invention relates to a stamped optic for use in an optics system of an optical communications module.

BACKGROUND OF THE INVENTION

A variety of optical communications modules are used in optical networks for transmitting and receiving optical data signals over the networks. An optical communications module may be an optical receiver module that has optical receiving capability, but not optical transmitting capability. Alternatively, an optical communications module may be an optical transmitter module that has optical transmitting capability, but not optical receiving capability. Alternatively, an optical communications module may be an optical transceiver module that has both optical transmitting and optical receiving capability.

A typical optical transmitter or transceiver module has a transmitter optical subassembly (TOSA) that includes a laser driver circuit, at least one laser diode and various other electrical components. The laser driver circuit outputs an electrical drive signal to each respective laser diode to cause the respective laser diode to be modulated. When the laser diode is modulated, it outputs optical signals that have power levels corresponding to logic 1s and logic 0s. An optics system of the module focuses the optical signals produced by each respective laser diode into the end of a respective transmit optical fiber held within an optical connector module that connects to the optical transmitter or transceiver module.

A typical optical receiver or transceiver module has a receiver optical subassembly (ROSA) that includes at least one receive photodiode and various other electrical components. An optics system of the ROSA focuses an optical data signal that is output from the end of an optical fiber onto a photodiode of the ROSA. The photodiode converts the incoming optical data signal into an electrical analog signal. An electrical detection circuit, such as a transimpedance amplifier (TIA), receives the electrical signal produced by the photodiode and outputs a corresponding amplified electrical signal, which is processed by other circuitry of the ROSA to recover the data.

Many different types of optical communications modules are available in the market, including single-channel optical transmitter and receiver modules, dual-channel optical transceiver modules, and parallel optical transmitter, receiver and transceiver modules. Many different types of optics systems are used in these optical communications modules. The optics systems perform the functions of collimating laser light into a collimated beam and directing the collimated beam, or portions thereof, in one or more directions. Typical optics systems include one or more refractive, diffractive, holographic, and/or reflective optics for performing these functions.

One of the difficulties associated with many optics systems that are currently used in optical communications modules is that they must be manufactured with very high precision, which can lead to high manufacturing costs. Another difficulty associated with many optics systems is that the relative positioning of the components of the optics system and the optoelectronic device (e.g., the laser diode or photodiode) must be very precise in order to avoid unacceptable optical losses and to ensure high signal integrity. Because of the need for very precise positioning of these components, the processes of aligning the components and securing them in position can be difficult and time consuming, which can also lead to higher costs.

A need exists for an optics system that can be manufactured with very high precision at relatively low cost and that facilitates the process of precisely positioning the optoelectronic devices and the optics system relative to one another inside of the modules.

SUMMARY OF THE INVENTION

The invention is directed to a stamped metal optic for use in an optical communications module and a method of forming the stamped metal optic. The stamped metal optic comprises a unitary, or integrally formed, metal body comprising a bench upon which at least one optoelectronic device is mounted in an aligned position, and a reflector integrally connected to the bench and optically aligned with the aligned position of the optoelectronic device such that an optical axis of the optoelectronic device is in optical alignment with an optical axis of the reflector.

The method comprises performing a sheet metal stamping process on a sheet metal work piece to form a plurality of stamped metal optics in the sheet metal work piece. Each stamped metal optic comprises a unitary, or integrally formed, metal body comprising a bench upon which at least one optoelectronic device is mounted in an aligned position and a reflector integrally connected to the bench and optically aligned with the aligned position of the optoelectronic device such that an optical axis of the optoelectronic device is in optical alignment with an optical axis of the reflector.

These and other features and advantages of the invention will become apparent from the following description, drawings and claims.

DETAILED DESCRIPTION OF AN ILLUSTRATIVE EMBODIMENT

Figure 1A:
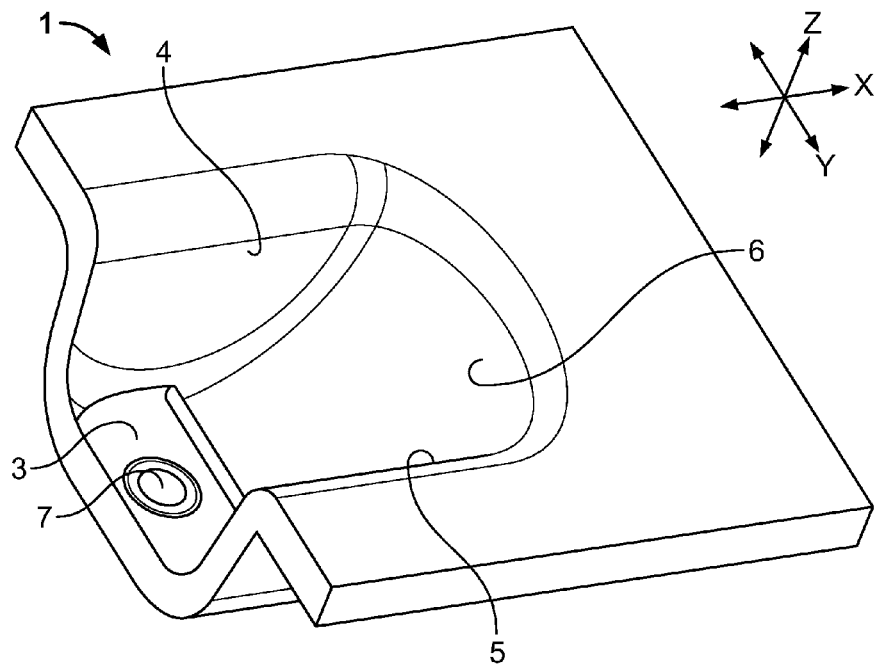
FIG. 1A illustrates a top perspective view of the stamped metal optic in accordance with an illustrative embodiment.

In accordance with embodiments of the invention, a stamped metal optic is provided that is a unitary, or integrally formed, part that includes at least a bench for holding at least one optoelectronic component and a reflector for folding an optical pathway. The stamped metal optic is formed of a piece of metal that is shaped using known metal stamping techniques. The stamped metal optic preferably has at least one fiducial mark formed therein that is used for placement of the optoelectronic device on the bench to ensure that the optoelectronic device is precisely aligned with the reflector. Because metal objects can be formed relatively inexpensively with high precision using known stamping techniques, the stamped metal optics can be manufactured with high precision at relatively low cost. Illustrative embodiments of the stamped metal optic will now be described with reference to FIGS. 1A-6B, in which like reference numerals represent like elements, components or features. It should be noted that elements, components or features in the figures are not necessarily drawn to scale.

Figure 1B:
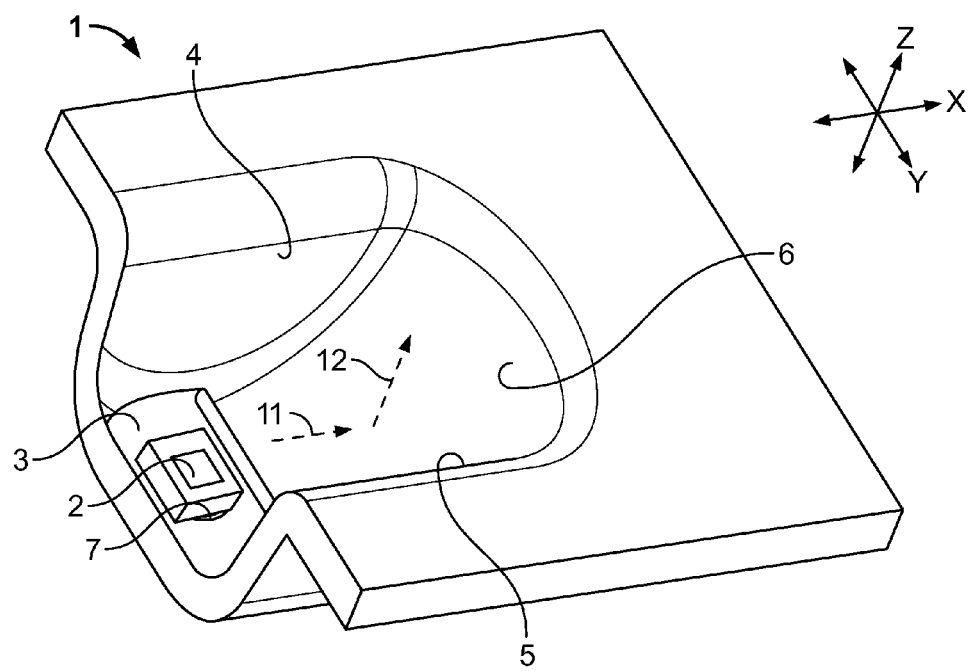
FIG. 1B illustrates a top perspective view of the stamped metal optic shown in FIG. 1A having an optoelectronic device mounted on it.
Figure 2:
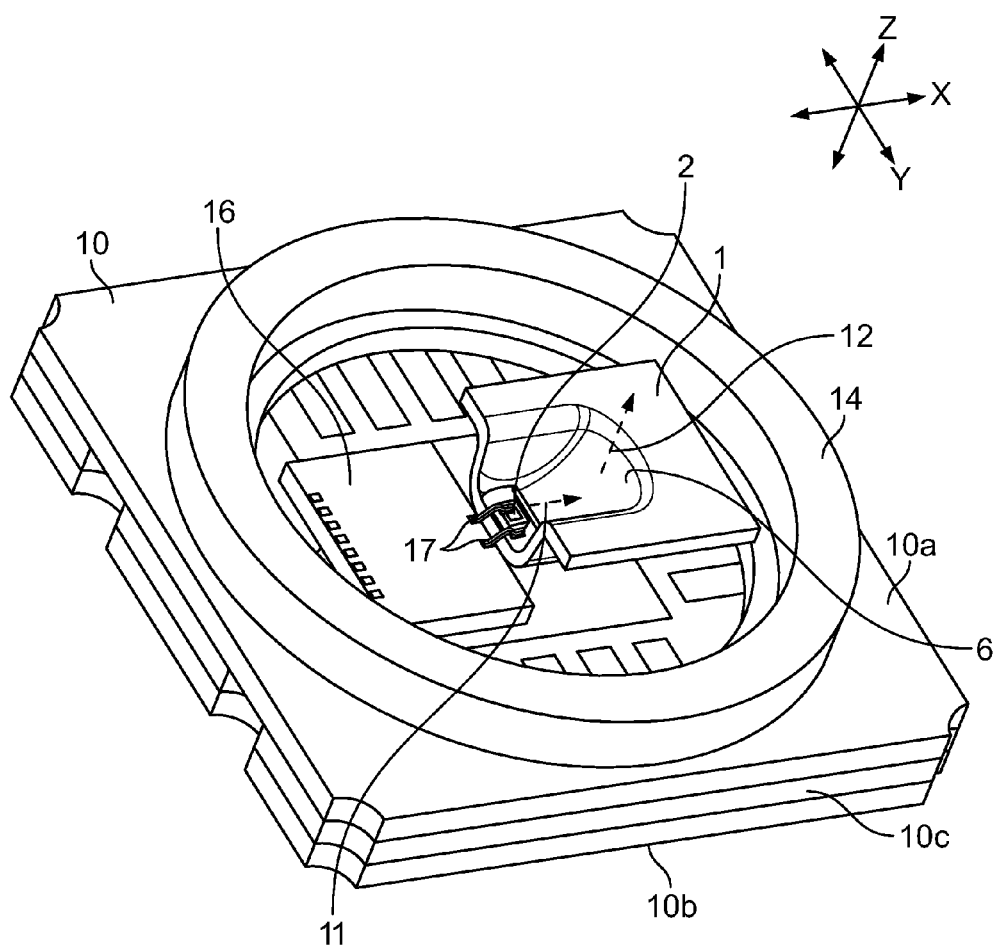
FIG. 2 illustrates a top perspective view of a base of a transistor-outline (TO) can assembly having the stamped metal optic shown in FIG. 1B mounted on an upper surface thereof.

FIG. 1A illustrates a top perspective view of the stamped metal optic 1 in accordance with an illustrative embodiment. FIG. 1B illustrates a top perspective view of the stamped metal optic 1 shown in FIG. 1A having an optoelectronic device 2 mounted on it. FIG. 2 illustrates a top perspective view of a base 10 of a transistor-outline (TO) can assembly having the stamped metal optic 1 with the optoelectronic device 2 shown in FIG. 1B mounted on an upper surface 10a thereof. The stamped metal optic 1 is formed by performing a stamping, or pressing, process on a sheet of metal. Although the sheet of metal is not limited to being any particular type of metal or having any particular thickness, it is typically a sheet of copper having a thickness of about four mils. The manner in which a sheet metal work piece is processed in a stamping process to obtain a stamped metal object having a desired shape is well known. As will be understood by persons of skill in the art, a typical stamping process involves using various stamping, or pressing, tools or machines to perform one or more of a variety of sheet metal forming processes such as, for example, punching, blanking, bending, drawing, flanging, embossing, and coining. In the interest of brevity, a detailed discussion of the stamping process that is used to form the stamped metal optic shown in FIGS. 1A-6B will not be provided herein.

The stamped metal optic 1 is a unitary piece of metal that has been subjected to a stamping process to give it the shape shown in FIGS. 1A-2, which is metal body having a generally flat bottom 3, first and second side walls 4 and 5, and a back wall 6. The generally flat bottom 3 functions as a bench for seating the optoelectronic device 2. For ease of discussion, the generally flat bottom 3 will be referred to herein as "the bench 3." All or a portion of the back wall 6 functions as the reflector for folding the optical pathway, as will be described below in detail. For ease of discussion, the back wall 6 will be referred to herein as "the reflector 6."

During the stamping process, a fiducial mark 7 is formed on the bench 3 (FIGS. 1A and 1B). The fiducial mark 7 functions as an optical alignment device for precisely aligning the optoelectronic device 2 with the reflector 6 during the process of placing the optoelectronic device 2 on the bench 3. The optoelectronic device 2 is typically secured to the bench 3 by an adhesive material (not shown), such as epoxy, for example. Typically, the process of placing the optoelectronic device 2 on the bench 3 will be performed by an automated system (not shown) that includes a machine vision system (not shown) that uses pattern recognition to find the center of the fiducial mark 7 and a robotic system (not shown) that aligns the optoelectronic device 2 with the center of the fiducial mark 7 and then places the optoelectronic device 2 on the bench 3 in the aligned position. When the optoelectronic device 2 is seated on the bench 3 in the aligned position, an optical axis of the optoelectronic device 2 is in precise optical alignment with the reflector 6. Although the process of aligning and placing the optoelectronic device 2 on the bench 3 is typically performed in this manner, the invention is not limited with respect to the manner in which the alignment and placement processes are performed.

In accordance with this illustrative embodiment, the reflector 6 is an aspherical reflector. Because of its aspherical shape, the reflector 6 not only reflects light, but also collimates light. For example, assuming that the optoelectronic device 2 is a laser, the laser 2 emits a diverging beam of laser light along an optical pathway (indicated by arrow 11) that is parallel to the X-axis of an X, Y, Z Cartesian Coordinate system. The diverging laser light beam 11 is simultaneously reflected and collimated by the aspherical reflector 6 to produce a collimated laser light beam that is directed along an optical pathway (indicated by arrow 12) that is parallel to the Z-axis of the X, Y, Z Cartesian Coordinate system. Thus, in accordance with this illustrative embodiment, the reflector 6 folds the optical pathway by an angle of 90°, or approximately 90°. It should be noted, however, that the reflector 6 could have a flat shape that would reflect, but not collimate, the diverging beam, in which case the optics system would typically include a collimating lens (not shown) that performs the collimating function. The reflector 6 could also have some other type of curved shape. Also, the reflector 6 could be shaped to fold the optical pathway by a non-zero angle that is other than 90°. The invention is not limited with respect to the angle by which the reflector 6 folds the optical pathway, although the angle typically ranges from about 70° to about 110°.

With reference to FIG. 2, in accordance with this illustrative embodiment the stamped metal optic 1 is used in a TO-can assembly, the base 10 of which is shown in FIG. 2. The stamped metal optic 1 is mounted on an upper surface 10a of the base 10. The stamped metal optic 1 is typically secured to the upper surface 10a of the base 10 by an adhesive material (not shown), such as epoxy, for example. In accordance with this illustrative embodiment, the base 10 comprises a ceramic material, such as multiple layers of aluminum oxide. The upper surface 10a of the base 10 functions as a mounting surface for mounting the components of a ROSA or TOSA of the TO-can assembly. A stainless steel ring 14 that is cylindrical in shape is secured to the upper surface 10a of the base 10. For ease of illustration and in the interest of brevity, the other components of the TO-can assembly are not shown in FIG. 2. However, a cap that is generally cylindrical in shape is typically secured to the ring 14 and a transparent window is typically secured to the inside walls of the cap to provide a hermetically-sealed environment for the electrical and optoelectronic components that are mounted on the upper surface 10a of the base 10.

An IC chip 16 is mounted on the upper surface 10a of the base 10 very near the optoelectronic device 2. Electrical bond wires 17 electrically connect contact pads of the IC chip 16 to contact pads of the optoelectronic device 2. Because of the close proximity of the IC chip 16 to the optoelectronic device 2, the bond wires 17 can be kept very short, which reduces the impedances of the bond wires 17.

In the case where the optoelectronic device 2 is a laser diode, the IC chip 16 is a laser diode driver IC chip. In that case, the laser diode driver IC chip 16 outputs electrical data signals over the bond wires 17 that modulate the modulation and/or bias currents of the laser diode 2 to cause it to emit an optical data signal in the direction indicated by arrow 11. The reflector 6 then reflects the optical data signal in the direction indicated by arrow 12 and collimates the optical data signal.

In the case where the optoelectronic device 2 is a photodiode, the IC chip 16 is a receiver IC chip. In that case, an optical data signal received in the TO-can assembly propagates in the direction opposite the direction indicated by arrow 12 and is incident on the reflector 6. The reflector 6 then reflects the optical data signal in the direction opposite the direction indicated by arrow 11 onto the photodiode 2. The photodiode 2 then converts the optical data signal into an electrical data signal and outputs the electrical data signal over bond wires 17 to the receiver IC chip 16. The receiver IC chip 16 then decodes the electrical data signal to recover the bits of data that were contained in the optical data signal. The IC chip 16 may of course perform additional or other operations.

One of the benefits of the stamped metal optic 1 is that it is much simpler than optical systems used in most known TO-can assemblies. The optics systems that are used in most known TO-can assemblies incorporate many very small, high-precision parts that must be placed in precise alignment with one another to perform the functions of folding the optical pathway and collimating the optical signal. These very small, high-precision parts are expensive to manufacture and difficult to align within the assemblies. The stamped metal optic 1 eliminates the need for many small, high-precision parts and simplifies the alignment process. The process of optically aligning the optoelectronic device 2 with the fiducial mark 7 (FIGS. 1 and 2) as the optoelectronic device 2 is mounted on the bench 3 brings the optoelectronic device 2 into precise optical alignment with the reflector 6. Therefore, the process of performing optical alignment is relatively simple and does not require aligning many parts. Also, because stamping processes can be performed with high precision at relatively low cost, the costs associated with manufacturing the stamped metal optic 1 are much less than the costs associated with manufacturing the types of high-precision parts that are often used in known TO-can assemblies.

Figure 3:
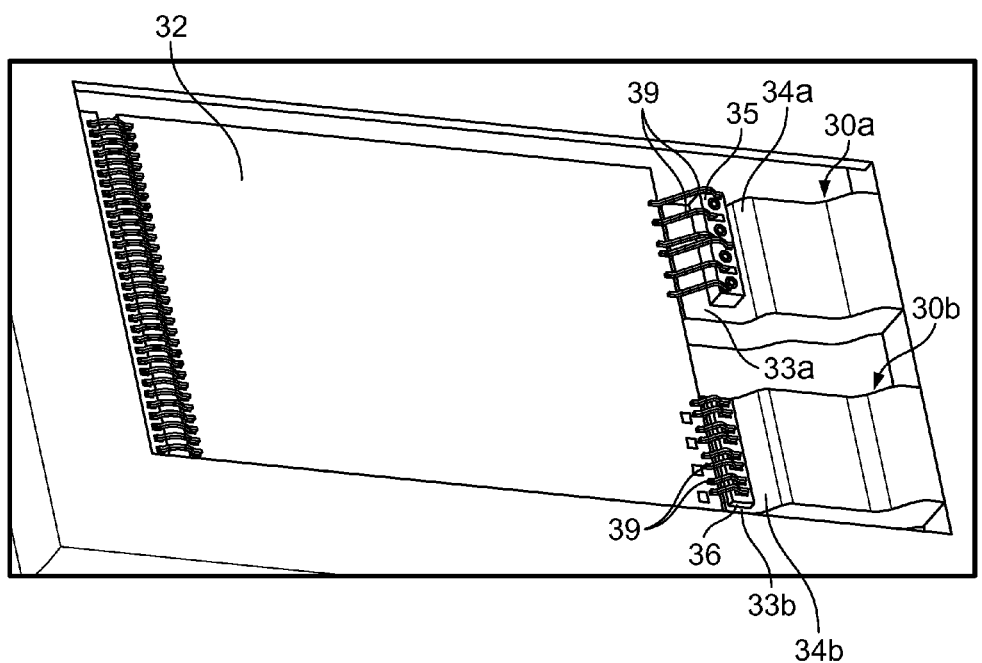
FIG. 3 illustrates a top perspective view of a portion of a parallel optical transceiver module that incorporates two stamped metal optics in accordance with another illustrative embodiment.

FIG. 3 illustrates a top perspective view of a portion of a parallel optical transceiver module that incorporates two stamped metal optics 30a and 30b in accordance with another illustrative embodiment. In accordance with this illustrative embodiment, the optical transceiver module in which the stamped metal optics 30a and 30b are used is a parallel optical transceiver module having a plurality of transmit channels and a plurality of receive channels. The stamped metal optics 30a and 30b are integrally formed in a metal leadframe 31 on which an IC chip 32 is mounted. Like the stamped metal optic 1 shown in FIGS. 1A-2, the stamped metal optics 30a and 30b have benches 33a and 33b, respectively, and reflectors 34a and 34b, respectively. A photodiode array chip 35 is mounted on the bench 33a and a laser diode array chip 36 is mounted on the bench 33b.

Like the stamped metal optic 1 shown in FIGS. 1A-2, each of the stamped metal optics 30a and 30b has at least one fiducial mark (not shown) integrally formed in it that is used to align the chips 35 and 36 with the benches 33a and 33b, respectively. The fiducial mark that is used for this purpose may be identical to the fiducial mark 7 shown in FIGS. 1A and 1B. Mounting the chips 35 and 36 on the benches 33a and 33b brings the optical axes of the photodiodes and laser diodes of the chips 35 and 36, respectively, into optical alignment with the reflectors 34a and 34b, respectively, in the same manner as described above with reference to FIGS. 1A-2.

In accordance with this illustrative embodiment, the photodiode chip 35 has four photodiodes and the laser diode chip 36 has four laser diodes. Therefore, in accordance with this illustrative embodiment, the parallel optical transceiver module is an eight-channel module having four transmit channels and four receive channels. Bond wires 39 connect contact pads of the chips 35 and 36 with contact pads of the IC chip 32. The IC chip 32 includes logic for providing both laser diode driver chip functionality and receiver chip functionality and may include additional logic for providing additional functionality. The reflectors 34a and 34b are identical to the reflector 6 (FIG. 1A) except that the reflectors 34a and 34b are longer than reflector 6 in order to provide the additional reflective surface area needed for the arrays of photodiodes and laser diodes of the chips 35 and 36, respectively. The reflectors 34a and 34b operate on light in the same manner in which the reflector 6 operates on light to fold the corresponding optical pathways.

Figure 4:
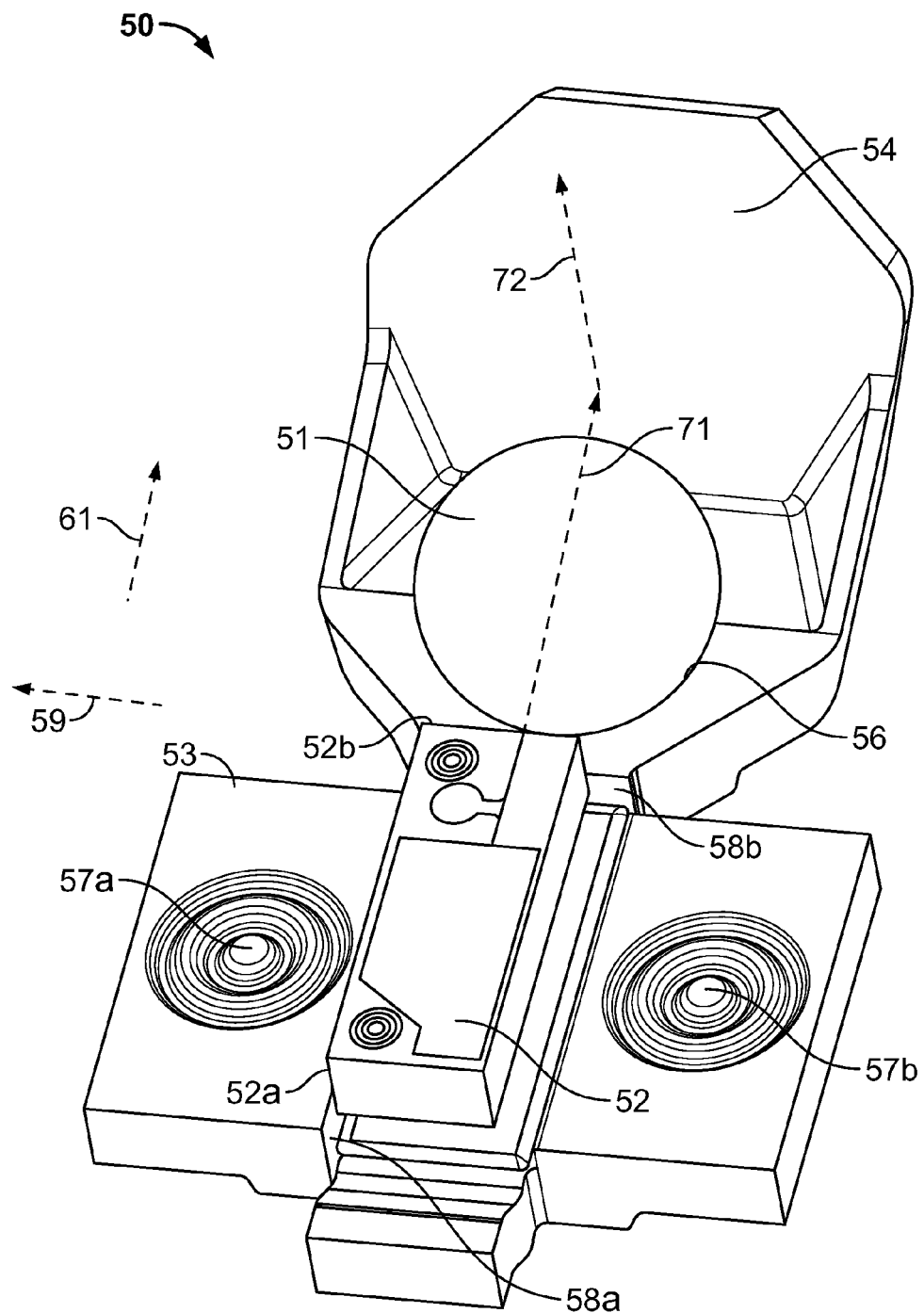
FIG. 4 illustrates a top perspective view of a stamped metal optic in accordance with another illustrative embodiment having a ball lens and a laser diode mounted thereon.
Figure 5:
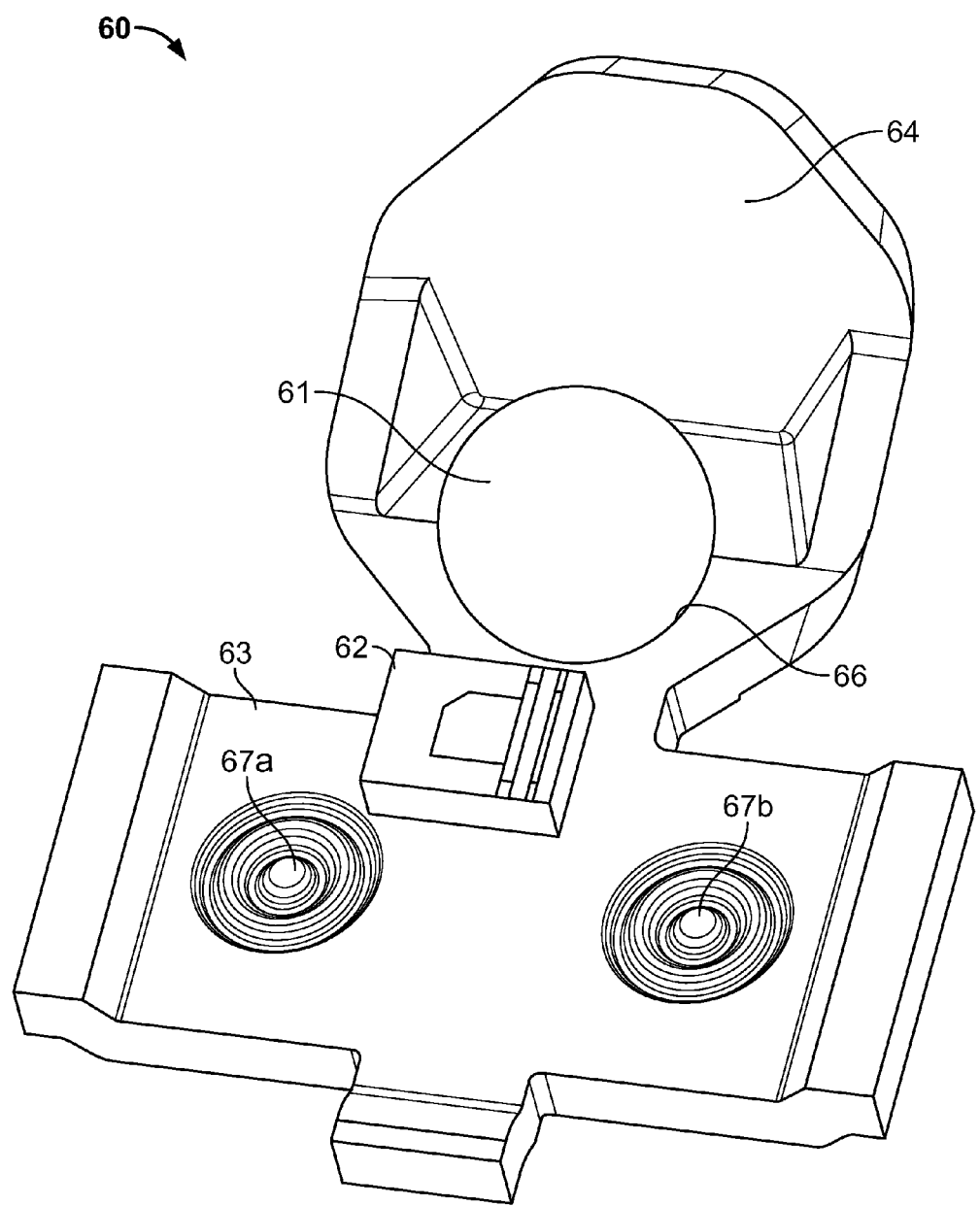
FIG. 5 illustrates a top perspective view of a stamped metal optic in accordance with another illustrative embodiment having a ball lens and a laser diode mounted thereon.

FIGS. 4 and 5 illustrate top perspective views of stamped metal optics 50 and 60, respectively, in accordance with two other illustrative embodiments having ball lenses 51 and 61, respectively, and laser diodes 52 and 62, respectively, mounted thereon. The laser diode 52 shown in FIG. 4 is an electro-absorption modulated laser (EML) diode whereas the laser diode 62 shown in FIG. 5 is a distributed feedback (DFB) laser diode. The stamped metal optics 50 and 60 are unitary, or integrally-formed, parts having benches 53 and 63, respectively, and reflectors 54 and 64, respectively.

The ball lenses 51 and 61 are seated in ball seats 56 and 66, respectively, which are circular tapered openings formed in the stamped metal optics 50 and 60, respectively. The ball lenses 51 and 61 are secured to the ball seats 56 and 66, respectively, by an attachment material, such as epoxy, for example. The ball seats 56 and 66 have inner surfaces that are complementary in shape to the shapes of the ball lenses 51 and 61, respectively. The circular tapered shapes of the ball seats 56 and 66 operate as passive alignment features for placing the ball lenses 51 and 61 in the ball seats 56 and 66, respectively. The ball seats 56 and 66 are aligned with the reflectors 54 and 64, respectively, such that when the ball lenses 51 and 61 are seated in the ball seats 56 and 66, respectively, the ball lenses 51 and 61 are brought into precise optical alignment with the reflectors 54 and 64, respectively. Two fiducial marks 57a and 57b are formed in the bench 53 of the stamped metal optic 50. Likewise, two fiducial marks 67a and 67b are formed in the bench 63 of the stamped metal optic 60. The fiducial marks 57a, 57b and 67a, 67b may be used to optically align the laser diodes 52 and 62 with the benches 53 and 63, respectively, during placement of the laser diodes 52 and 62 on the benches 53 and 63, respectively.

A machine vision system (not shown) and a robotic system (not shown) of the type described above with reference to FIGS. 1A-2 may be used to perform the aforementioned alignment and placement processes. The machine vision system uses a pattern matching and correlation algorithm to locate the centers of the fiducial marks 57a, 57b relative to the laser diode 52. The robotic system is controlled by control signals sent to it by the machine vision system to cause it to place the laser diode 52 on the bench 53 at a preselected location in alignment with the ball lens 51 and the reflector 54. Likewise, the machine vision system locates the centers of the fiducial marks 67a, 67b relative to the laser diode 62 and causes the robotic system to place the laser diode 62 on the bench 63 at a preselected location in alignment with the ball lens 61 and the reflector 64. The laser diodes 52 and 62 are typically secured to the benches 53 and 63, respectively, by an attachment material such as epoxy, for example. Machine vision systems and algorithms and robotic placement systems and algorithms that are suitable for performing these processes are well known in the industry. Therefore, in the interest of brevity, these systems and algorithms will not be described herein in further detail.

An alternative to using the fiducial marks 57a, 57b and 67a, 67b is to use passive alignment features for this purpose, as will now be described with reference to FIG. 4. The stamped metal optic 50 is shown in FIG. 4 as having a side stop 58a and a front stop 58b formed in the bench 53. The side stop 58a and the front stop 58b act as passive alignment features for aligning and placing the laser diode 52. During the process of aligning the laser diode 52 on the bench 53, the laser diode 52 is placed on the bench and moved in the directions indicated by arrows 59 and 61 until the left side 52a and front side 52b of the laser diode 52 are in abutment with the side stop 58a and the front stop 58b, respectively. In this position, the laser diode 52 is in alignment with the ball lens 51, which is in precise optical alignment with the reflector 54.

The passive alignment process may be performed by the aforementioned machine vision and robotic systems or it may be performed by hand by a person. If the stops 58a and 58b are present, the fiduciary marks 57a and 57b are not needed. Conversely, if the fiduciary marks 57a and 57b are present, the stops 58a and 58b are not needed.

In accordance with the illustrative embodiments shown in FIGS. 4 and 5, the reflectors 54 and 64 are flat surfaces that perform only reflection of the optical data signals. Collimation of the optical data signals is performed by the respective ball lenses 51 and 61. Because the stamped metal optics 50 and 60 perform identical optical operations, the optical operations will be described only with reference to the stamped metal optic 50 shown FIG. 4. The stamped metal optic 50 may be mounted on a TO-can assembly base such as that shown in FIG. 2, for example, although the stamped metal optic 50 is not limited to being used in any particular type of optical communications module. The optical data signal emitted by the laser diode 52 is a diverging optical signal that is collimated by ball lens 51 into a collimated optical signal. The ball lens 51 directs the collimated optical signal in the direction indicated by arrow 71 onto the reflector 54. The reflector 54 then folds the optical pathway by reflecting the collimated optical signal in the direction indicated by arrow 72. In accordance with this illustrative embodiment, the reflector 54 folds the optical pathway by an angle of 90°, but could be configured to fold the optical pathway by any non-zero angle relative to the optical axis of the laser diode 52.

Figure 6A:
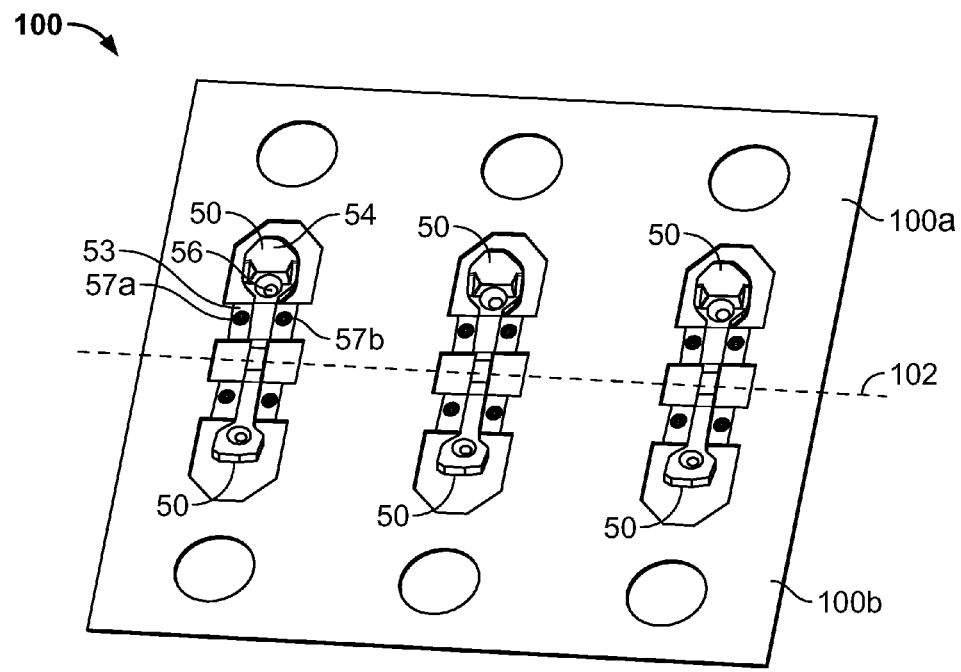
FIG. 6A illustrates a top perspective view of a sheet metal leadframe strip that has been processed via a stamping process to form a plurality of the stamped metal optics shown in FIG. 4.
Figure 6B:
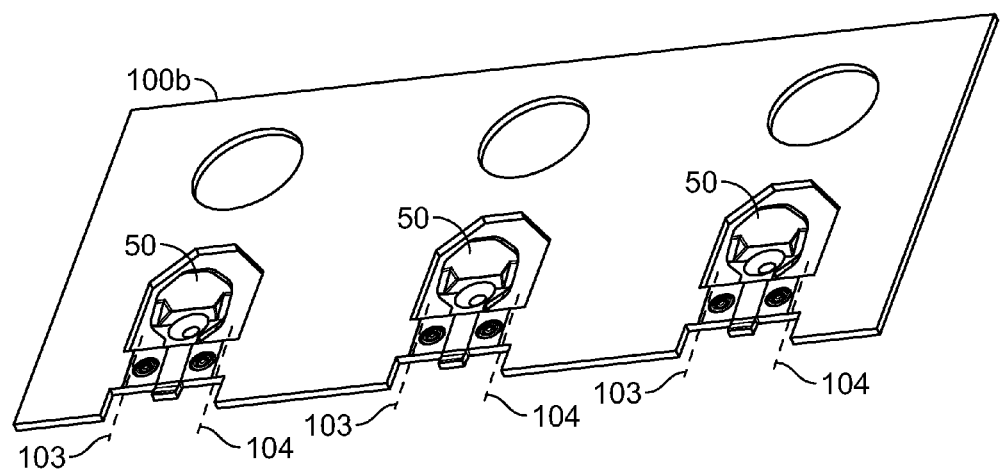
FIG. 6B illustrates a top perspective view of a substrip of the sheet metal leadframe strip shown in FIG. 6A.

FIG. 6A illustrates top perspective views of a sheet metal leadframe strip 100 that has been processed via a stamping process to form a plurality of the stamped metal optics 50 shown in FIG. 4. FIG. 6B illustrates a top perspective view of a substrip of the sheet metal leadframe strip 100 shown in FIG. 6A. While a strip 100 is shown in FIG. 6A, the stamped metal optics 50 may instead be formed in a continuous roll of sheet metal via a stamping process.

Because symmetry is often important to achieving successful precision stamping, the stamped metal optics 100 are symmetrically formed back to back in pairs to create the desired symmetry. A shearing operation is then performed across the strip 100 along the area represented by dashed line 102 in FIG. 6A to separate the strip 100 into substrips 100a and 100b. One of the substrips 100a is shown in FIG. 6B. A shearing operation is then performed along the joints represented by dashed lines 103 and 104 shown in FIG. 6B to separate the individual optics 50 from the substrip 100a. Preferably, the metal is raised slightly at the locations where the shearing operations will occur so that any burr caused by shearing will not prevent the optics 50 from sitting flatly on any mounting surface to which they are later secured.

Prior to the shearing operations being performed, the leadframe strips 100 may be fed through die attachment and ball attachment machines that automatically attach the dies 52 and the ball lenses 51 to the respective optics 50. Typically, the leadframe strips 100 will be loaded into magazines that are subsequently used in the die attach, ball attach and shearing processes to feed the strips 100 into the respective machines. Once the dies 52 and the ball lenses 51 have been attached to the strips 100 and before the shearing process is performed, the optics 50 may be tested. Thus, the entire process of forming the optics 50, attaching the dies 52 and ball lenses 51, testing the optics 50, and singulating the optics 50 may be performed in a continuous automated process. After the optics 50 have been singulated, they can be attached to respective mounting surfaces of respective optical communications modules. The processes described above with reference to FIGS. 6A and 6B may be used to produce all of the stamped metal optics 1, 30a, 30b, 50, and 60. The reflectors of the stamped metal optics 1, 30a, 30b, 50, and 60 may be coated or plated with a reflective material, such as gold, for example, to enhance reflectivity.

It should be noted that the invention has been described with reference to illustrative embodiments for the purposes of demonstrating the principles and concepts of the invention. Many modifications may be made to the illustrative embodiments described herein without deviating from the scope of the invention. For example, although examples of the stamped metal optics have been shown in the figures as having particular shapes, the stamped metal optics are not limited to these shapes, as will be understood by persons of skill in the art in view of the description being provided herein. The stamped metal optic also is not limited to being used in any particular type of optical communications module. Persons skilled in the art will understand, in view of the description provided herein, that all such modifications are within the scope of the invention.

What is claimed is:

1. An optoelectronic module, comprising:
a unitary metal body having a bench, a reflector integrally connected to and opposed to the bench and a ball lens seat, the ball lens seat located in the unitary metal body along an optical path between the bench and the reflector, the reflector arranged to fold the optical path by a non-zero angle;
an optoelectronic device mounted in an aligned position with the optical path on the bench; and
a ball lens secured in the ball lens seat.

2. The optoelectronic module of claim 1, wherein a surface of the reflector facing the ball lens is plated with a reflective metal.

3. A stamped metal optic, comprising:
a unitary, or integrally formed, metal body having a bench upon which at least one optoelectronic device is mounted in an aligned position and a reflector integrally connected to the bench and optically aligned with said aligned position such that an optical axis of the optoelectronic device is in optical alignment with an optical axis of the reflector;

at least a first ball lens seat formed in the unitary metal body in between the aligned position of the optoelectronic device and the reflector; and at least a first ball lens seated in and fixedly secured to the first ball lens seat, wherein the reflector is flat in shape, wherein said at least one optoelectronic device is a photodiode, wherein the reflector receives a collimated light beam that is incident on the reflector at an angle of incidence and reflects the received collimated light beam onto the first ball lens at a non-zero angle relative to the angle of incidence, and wherein the first ball lens focuses the collimated light beam received thereby onto the photodiode.

4. The stamped metal optic of claim 3, wherein the unitary metal body further comprises:

at least a first fiduciary mark formed in the bench adjacent said aligned position of the optoelectronic device, the fiducial mark containing alignment information for mounting the optoelectronic device on the bench.

5. The stamped metal optic of claim 3, wherein at least the reflector is gold plated.

6. A stamped metal optic, comprising:

a unitary, or integrally formed, metal body having a bench upon which at least one optoelectronic device is mounted in an aligned position and a reflector integrally connected to the bench and optically aligned with said aligned position such that an optical axis of the optoelectronic device is in optical alignment with an optical axis of the reflector;

at least a first ball lens seat formed in the unitary metal body in between the aligned position of the optoelectronic device and the reflector; and at least a first ball lens seated in and fixedly secured to the first ball lens seat, wherein the reflector is flat in shape, wherein said at least one optoelectronic device is a laser diode that emits a diverging light beam that is incident on the first ball lens, wherein the first ball lens collimates the diverging light beam into a collimated light beam and directs the collimated light beam onto the reflector, and wherein the reflector reflects the collimated light beam by a non-zero angle relative to an angle of incidence of the diverging light beam on the reflector.

7. A method for forming a stamped metal optic for use in an optical communications module, the method comprising:

performing a sheet metal stamping process on a sheet metal work piece to form a plurality of metal optics in the sheet metal work piece, each metal optic having a unitary, or integrally formed, metal body comprising:

a bench;

a reflector integrally connected to the bench; and a ball lens seat between the bench and the reflector.

8. The method of claim 7, wherein the reflector is flat.

9. The method of claim 7, further comprising:

performing a shearing process to singulate the metal body from the sheet metal work piece.

10. The method of claim 3, further comprising:

performing a plating process to plate the reflector of the metal body with a reflective metal.

11. The method of claim 6, wherein the reflective metal is gold.

* * * * *